(12) United States Patent
Huang et al.

(10) Patent No.: US 9,279,914 B2
(45) Date of Patent: Mar. 8, 2016

(54) CONDENSING LENS, COMPOUND-EYE LENS CONDENSER, AND COMPOUND-EYE CONCENTRATING SOLAR CELL ASSEMBLY

(75) Inventors: Zhong Huang, Chengdu (CN); Han Liu, Sichuan (CN); Shaochun Li, Sichuan (CN)

(73) Assignee: CHENGDU ZSUN SCIENCE AND TECHNOLOGY DEVELOPING CO., LTD., Chengdu (CN)

( * ) Notice: Subject to any disclaimer, the term of this patent is extended or adjusted under 35 U.S.C. 154(b) by 118 days.

(21) Appl. No.: 13/582,829

(22) PCT Filed: Aug. 15, 2011

(86) PCT No.: PCT/CN2011/078396
§ 371 (c)(1),
(2), (4) Date: Sep. 5, 2012

(87) PCT Pub. No.: WO2012/025019
PCT Pub. Date: Mar. 1, 2012

(65) Prior Publication Data
US 2013/0139867 A1    Jun. 6, 2013

(30) Foreign Application Priority Data

Aug. 27, 2010    (CN) .......................... 2010 1 0264040

(51) Int. Cl.
| | | |
|---|---|---|
| G02B 27/14 | (2006.01) | |
| G02B 13/18 | (2006.01) | |
| G02B 3/02 | (2006.01) | |
| G02B 3/00 | (2006.01) | |
| G02B 3/06 | (2006.01) | |
| G02B 19/00 | (2006.01) | |
| H01L 31/054 | (2014.01) | |

(52) U.S. Cl.
CPC ................ *G02B 3/0037* (2013.01); *G02B 3/00* (2013.01); *G02B 3/0056* (2013.01); *G02B 3/06* (2013.01);

(Continued)

(58) Field of Classification Search
CPC .. G02B 27/09; G02B 27/095; G02B 27/0961; G02B 27/0966; G02B 27/2214; G02B 27/0955; G02B 13/18; G02B 19/0014; G02B 26/0875; G02B 27/0012; Y02E 60/122; Y02E 10/52; G01N 2201/068; G01N 2021/6478; G01N 21/43; H01L 51/5275
USPC .......... 359/626, 710, 619, 623, 648, 708, 718
See application file for complete search history.

(56) References Cited

U.S. PATENT DOCUMENTS

| | | |
|---|---|---|
| 3,232,795 A | 2/1966 | Gillette et al. |
| 3,923,381 A | 12/1975 | Winston |

(Continued)

FOREIGN PATENT DOCUMENTS

| | | |
|---|---|---|
| CN | 100493894 C | 6/2009 |
| CN | 101719524 A | 6/2010 |
| CN | 201859227 U | 6/2011 |

*Primary Examiner* — Alicia M Harrington
(74) *Attorney, Agent, or Firm* — Novick, Kim & Lee, PLLC; Allen Xue

(57) ABSTRACT

A condensing lens, compound-eye lens condenser, and compound-eye concentrating-type solar cell assembly. The condensing lens is a convex lens that can reflect mutually parallel incident lights (3) onto a receiving surface (4) on the outer side of the lens and thus form spots. If the vertical distance from the contact point of any incident lights (3) contacting the lens to a light axis (103) of the lens is x, the vertical distance between a projection point formed from the incident light (3) reflecting onto the receiving surface (4) and the center of the spot is m, the radius of the lens is a, and the radius of the spot is b, then the lens meets the following condition: x/m=a/b. The condensing lens has a high transmission rate, and the energy distribution of the spots is more even after condensing, the transmission rate is 90% to 93%, and the energy distribution curve of the spots transmitted through the condensing lens is similar to saddle-shaped.

12 Claims, 3 Drawing Sheets

(52) U.S. Cl.
CPC ........ *G02B 19/0014* (2013.01); *G02B 19/0042* (2013.01); *G02B 19/0076* (2013.01); *H01L 31/0543* (2014.12); *Y02E 10/52* (2013.01)

(56) References Cited

U.S. PATENT DOCUMENTS

| | | | |
|---|---|---|---|
| 4,042,417 A | 8/1977 | Kaplow et al. | |
| 4,050,895 A * | 9/1977 | Hardy et al. | 436/527 |
| 5,578,140 A | 11/1996 | Yogev et al. | |
| 8,491,121 B2 * | 7/2013 | Tilleman et al. | 351/208 |
| 2002/0007845 A1 | 1/2002 | Collette et al. | |
| 2003/0026536 A1 * | 2/2003 | Ho | 385/33 |
| 2003/0201007 A1 | 10/2003 | Fraas et al. | |
| 2005/0111105 A1 * | 5/2005 | Tanaka | 359/619 |
| 2006/0209310 A1 * | 9/2006 | Muenz et al. | 356/521 |
| 2008/0314436 A1 * | 12/2008 | O'Connell et al. | 136/246 |
| 2010/0123954 A1 * | 5/2010 | Benitez et al. | 359/626 |
| 2010/0212719 A1 * | 8/2010 | Stolum | 136/246 |

\* cited by examiner

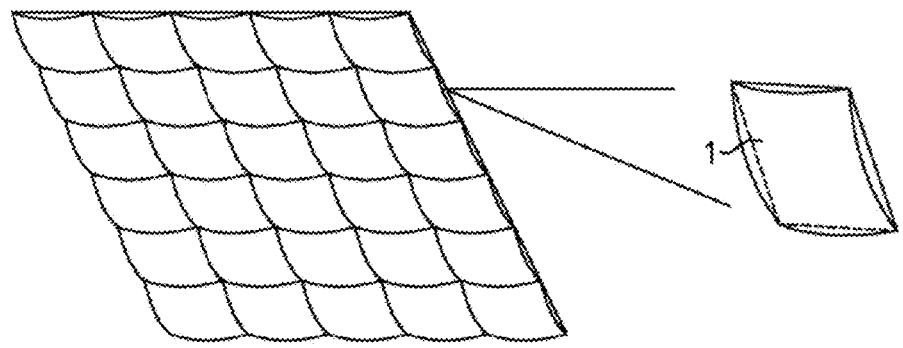
Figure 1(a)   Figure 1(b)
Figure 1
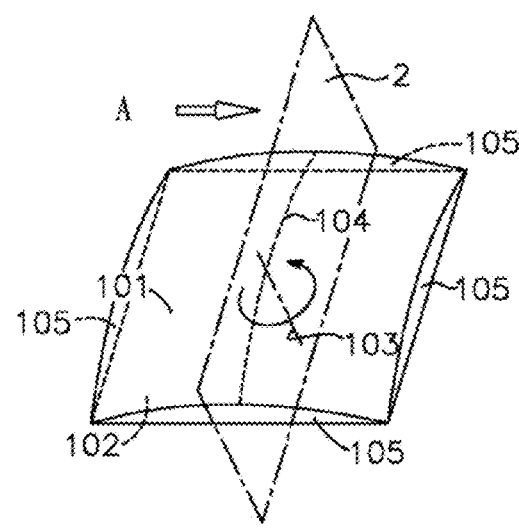
Figure 2
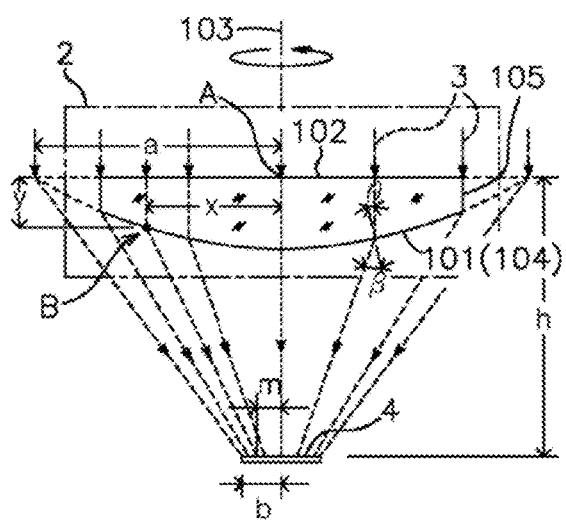
Figure 3

CONDENSING LENS, COMPOUND-EYE LENS CONDENSER, AND COMPOUND-EYE CONCENTRATING SOLAR CELL ASSEMBLY

TECHNICAL FIELD

The current invention is generally related to condensing photovoltaic electricity generating technology, in which sun light is concentrated and projected to condensing lens and compound-eye lens condenser of photovoltaic batteries. The current invention is further related to a compound-eye concentrating-type solar cell assembly based on above mentioned condensing lens and compound-eye lens condenser.

BACKGROUND ART

Concentrating photovoltaic electricity generation technology is widely accepted as an effective way to reduce cost of photovoltaic electricity generation. At present, a complete system for concentrating photovoltaic electricity generation mainly comprises a compound-eye concentrating photovoltaic assembly, a sun-tracker, and electric energy storage or inversion equipment. As a photo-electric conversion element, the compound-eye concentrating photovoltaic assembly comprises a compound-eye lens condenser and a circuit board installed with photovoltaic wafers.

The compound-eye lens condenser comprises a plurality of planar-arrayed condensing lens. During operation, the sun-tracker keeps the condensing lenses facing the sun perpendicularly for most of the time, then the condensing lenses focus the sun light and project it to the receiving surfaces of corresponding photovoltaic wafers on the circuit board to generate electric current in each of the photovoltaic wafer, then the electric current is exported by the circuits on the circuit board.

The concentrating solar cell assembly disclosed in patent application with disclosure number CN101640502A is very typical. The point-focusing Fresnel lens implemented in the assembly is widely recognized as the optimal option for condensing lens. There are additional references that disclose concentrating Fresnel lens as the condensing lens for concentrating photovoltaic electricity generation, such additional references are not included herein.

Actually, implementing Fresnel lens is not without shortcomings. For example, manufacturing defects on the surface texture of Fresnel lens cause loss in incoming light, resulting in a relatively low transmission rate of around 75%; such manufacturing defects are very hard to avoid under current technologies. As another example, Fresnel lens can be considered a combination of multiple co-axis convex lenses; as a result, the energy distribution of the focus light spot produced by Fresnel lens is not sufficiently uniform.

Replacing Fresnel lens with widely used ordinary spherical lens can solve the problem of low transmission rate. Spherical lens can only, however, focus light on the focal point of the lens, so no matter where the photovoltaic wafer is located, either in the front of the focal point, or further away from the focal point, uneven energy distribution will result on the receiving surface of the photovoltaic wafer, in the center and on the rim of the light spot, causing internal voltage difference in the wafer, producing internal current, such internal current is partially consumed inside the wafer, resulting in reduced output power from the wafer; additionally, internal current is the major cause for wafer internal temperature rise, while wafer internal temperature rises in term reduces efficiency of concentrating photovoltaic assembly.

DETAILED DESCRIPTION

The current invention offers technical solution by providing a condensing lens that provides a high transmission rate and produces uniformly distributed energy on the focus spot after condensing; the current invention further provides a compound-eye lens condenser that utilizes the condensing lens.

The technical solution provided in the current invention is implemented by: a condensing lens, in which, the lens is a convex lens that refracts parallel incoming light to a receiving surface located on the outer side of the lens to form a light spot, which is characterized by: assuming x being the perpendicular distance between the point of intersection, where an arbitrary incoming light intersecting the lens, and the optical axis of the lens, m being the perpendicular distance between the projection point, generated by the refracted incoming light projecting on the receiving surface, and the center of the light spot, a being the radius of the lens, b being the radius of the light spot, then the lens satisfies the following condition: x/m=a/b.

As a preferred embodiment of the above technical solution, the lens having a rotating convex surface with the optical axis as the rotating axis and a flat end surface opposite to the rotating convex surface, the curve on the intersection between the rotating convex surface and an arbitrary longitudinal section which crosses the lens optical axis is a curve which can refract incoming light, said light is radially distributed within the longitudinal section and parallel to the optical axis, to the receiving surface to form a focal line, the curve function for the curve, in a planar coordinate system located on the longitudinal sectional surface with the origin of the coordinate system being the center of the flat end surface, can be described as follows:

$$(h+y) \frac{n \frac{dy}{dx}}{\sqrt{1+\left(\frac{dy}{dx}\right)^2}} - \frac{dy}{dx} \sqrt{1-n^2 \frac{\left(\frac{dy}{dx}\right)^2}{1+\left(\frac{dy}{dx}\right)^2}}}{\sqrt{1-n^2 \frac{\left(\frac{dy}{dx}\right)^2}{1+\left(\frac{dy}{dx}\right)^2}} + n \sqrt{\frac{\left(\frac{dy}{dx}\right)^2}{1+\left(\frac{dy}{dx}\right)^2}}} = \left(1+\frac{b}{a}\right)x$$

where, the coefficient h is the distance between the flat end surface and the receiving surface; coefficient a is the radius of the lens; coefficient b is the half length of the focal line; coefficient n is the refractive index of the lens; variable x is the horizontal distance between an arbitrary point on the curve and the lens optical axis, variable y is the longitudinal distance between the point and flat end surface.

It should be pointed out, that the curve function cannot be obtained through limited number of experiments conducted by the applicant under the guidance of existing technology. In fact, the curve function is based on applicant's creative realization that, in order to produce uniformly distributed energy on the focus spot after condensing, a better solution is to proportionally condense light onto the receiving surface through the rotating convex surface of the lens. That is, after incoming light passes through an arbitrary point on the curve and is refracted to the receiving surface, the ratio between x and m, x being the x coordinate of the point on the curve function, m being horizontal distance between the projection point on the receiving surface and optical axis of the lens, should be equal to the ratio between a and b, a being the radius of the lens, b being the half length of the projection line, i.e., x/m=a/b. Based on known rules of refraction for lens and above equations, the following equations can be obtained:

$$x/m = a/b \tag{1}$$

$$\sin(\theta) = n\sin(\beta) \tag{2}$$

$$x - m = (h - y)\tan(\beta - \theta) \tag{3}$$

$$\tan(\theta) = \frac{dy}{dx} \tag{4}$$

in which, variables $\theta$ and $\beta$ represent respectively angle of incidence and angle of refraction when light beam passes through the curve. Other coefficients and variables are already explained above. Based on the above equations, the above curve function can be obtained through mathematical derivation.

The shape of the rotating convex surface determined by the curve function can be fully achieved in industrial engineering settings. Currently, lenses are typically manufactured through molding; the molded shape of the rotating convex surface is controlled by design of the mold. During the process of mold design, it is as simple as entering the above curve function into the mold design software, then the curve is generated from the curve function, then the curve is rotated to generate the theoretical digital model of the rotating convex curve surface; during the process of mold manufacturing, the corresponding mold cavity is manufactured by CNC machine tool.

The applicant further points out, that the condensing lens with the special curve function disclosed above is an example of the condensing lenses claimed in the current invention, the example is to be understood for illustration purpose only. Actually, the condensing lens characterized by the special curve is a plano-convex lens, so incoming light parallel to the optical axis of the lens is refracted only once by the rotating convex surface of the lens, accordingly, x is the perpendicular distance between the point of intersection, where an arbitrary incoming light intersecting the lens, and the optical axis of the lens, x is also the abscissa of the point where incoming light crossing the curve function; b is the radius of the light spot, or the half length of the focal line formed by refracting the parallel incoming light and focusing them on the receiving surface; m is the perpendicular distance between the projection point, generated by the refracted incoming light projected on the receiving surface, and the center of the light spot.

In spite of the fact that plano-convex lens is structurally simple and has the advantage of being easy for design and manufacturing, other equivalent designs can be implemented to replace the curve function disclosed above. For example, double convex lens with two rotating convex surfaces can be implemented. As long as the condition x/m=a/b is satisfied (in which, x is the perpendicular distance between the point of intersection, where an arbitrary incoming light intersecting the lens, and the optical axis of the lens, x is also the abscissa of the point where incoming light crossing the curve function; m is the perpendicular distance between the projection point, generated by the refracted incoming light projected on the receiving surface, and the center of the light spot; b is the radius of the light spot, or the half length of the focal line formed by refracting the parallel incoming light and focusing them on the receiving surface; a is the radius of the lens), with additional known lens refractive rules, curve functions of the two rotating convex curve surface can be derived, and accordingly the theoretical digital model of the two rotating convex curve surface.

The compound-eye lens condenser, in which, a plurality of planar arrayed condensing lenses are adhered on a transparent glass panel, combined with circuit board, to form a box-structured compound-eye concentrating-type solar cell assembly. The condensing lenses can also be one piece with the glass panel.

Specifically, each of the condensing lens has a rotating convex surface with the optical axis as the rotating axis and a flat end surface opposite to the rotating convex surface, the curve on the intersection between the rotating convex surface and an arbitrary longitudinal section which crosses the lens optical axis is a curve which can refract incoming light, which is radially distributed within the longitudinal section and parallel to the optical axis, to the receiving surface to form a focal line, the curve function for the curve, in a planar coordinate system located on the longitudinal sectional surface with the origin of the coordinate system being the center of the flat end surface, can be described as follows:

$$(h+y)\frac{n\dfrac{\frac{dy}{dx}}{\sqrt{1+\left(\frac{dy}{dx}\right)^2}} - \dfrac{dy}{dx}\sqrt{1-n^2\dfrac{\left(\frac{dy}{dx}\right)^2}{1+\left(\frac{dy}{dx}\right)^2}}}{\sqrt{1-n^2\dfrac{\left(\frac{dy}{dx}\right)^2}{1+\left(\frac{dy}{dx}\right)^2}} + n\sqrt{\dfrac{\left(\frac{dy}{dx}\right)^2}{1+\left(\frac{dy}{dx}\right)^2}}} = \left(1+\frac{b}{a}\right)x$$

where, the coefficient h is the distance between the flat end surface and the receiving surface; coefficient a the radius of the lens; coefficient b is the half length of the focal line; coefficient n is the refractive index of the lens; variable x is the horizontal distance between an arbitrary point on the curve and the lens optical axis, variable y is the longitudinal distance between the point and flat end surface.

Further, the edge of each the lens is cut into polygon structure with at least three cylindrical surfaces; any two neighboring condensing lenses in the compound-eye lens condenser are adhered together at their adjacent cylindrical surfaces. Evidently, that the purpose for doing so is for the convenience of forming planar arrays of condensing lenses to produce a compound-eye lens condenser.

Specifically, the edge of each of the individual lens is cut into quadrilateral structure with four cylindrical surfaces, in which, neighboring cylindrical surfaces are perpendicular to each other; any two neighboring condensing lenses in the compound-eye lens condenser are adhered together by their adjacent cylindrical surfaces to form a rectangular array of the condensing lenses for the compound-eye lens condenser. Additional benefit of cutting the edge of the condensing lens into quadrilateral structure is that the shape of focused light spot through the lens is quadrilateral, making it practical to make corresponding photovoltaic wafers quadrilateral during manufacturing. Quadrilateral structure is easy to process during wafer cutting and such quadrilateral cutting saves large amount of wafer materials.

The current invention further provides a compound-eye concentrating-type solar cell assembly that implements the compound-eye lens condenser.

The advantages of the current invention include: the transmission rate of the condensing lens is proved by optical simulation to be as high as 90% to 93%, and the energy distribution curve of the focused light spot is almost saddle-shaped, that is, the light spot energy is uniformly distributed. The condensing lens disclosed in the current invention can not only be used in focusing photovoltaic electricity generation, it can also be utilized in other optical equipment where uniform focusing is required.

DESCRIPTION OF THE FIGURES

FIG. 1 is a schematic illustration of the compound-eye lens condenser.

FIG. 1(a) is the overall schematic illustration of the compound-eye lens condenser.

FIG. 1(b) is the schematic illustration of a single condensing lens in the compound-eye lens condenser.

FIG. 2 is an amplified view of FIG. 1(b).

FIG. 3 is a full cut away view of FIG. 2 in A direction (section is longitudinal section 2).

In FIG. 4, brightness of light pot illustrated the level of energy, the brighter the higher energy.

In FIG. 5, abscissa is the width of light spot, ordinate is energy intensity. Accordingly, FIG. 5 can be considered as light spot energy distribution observed on the horizontal section or longitudinal section of FIG. 4.

In FIG. 7, abscissa is the width of light spot, ordinate is energy intensity. Accordingly, FIG. 7 can be considered as light spot energy distribution observed on the horizontal section or longitudinal section of FIG. 6.

EMBODIMENTS

The current invention is further described with reference to the figures.

Figure 9:
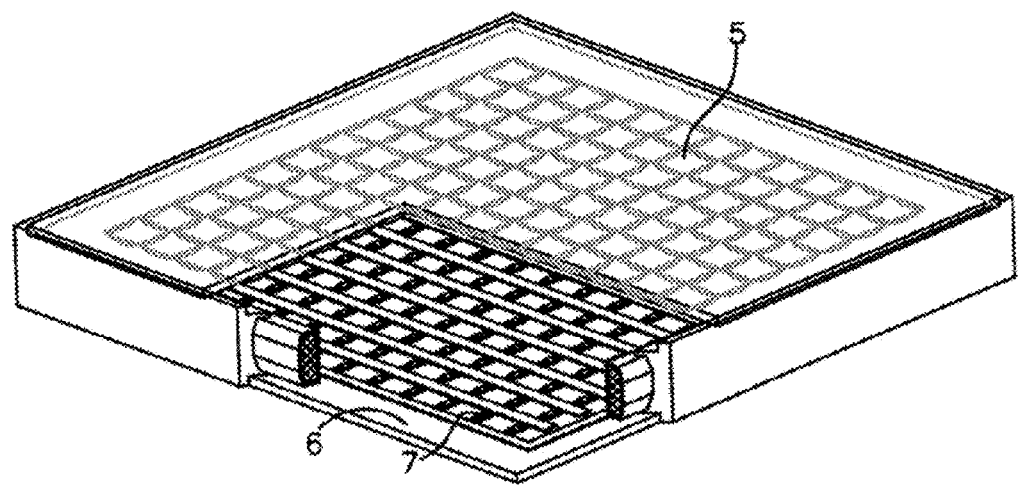
FIG. 9 is the structural illustration of the compound-eye concentrating-type solar cell assembly disclosed in the current invention.

FIG. 9 illustrates a compound-eye concentrating-type solar cell assembly, which is a box structure comprising: a compound-eye lens condenser (5) and a plurality of photovoltaic wafer (7) installed on a circuit board (6); in which, as illustrated in FIGS. 1-3, the compound-eye lens condenser (5) comprising a plurality of planar arrayed condensing lens (1), each of the condensing lens (1) is a convex lens which is capable of refracting incoming light (3) parallel to the optical axis (103) to a receiving surface (4) of a photovoltaic wafer (7) located on the outer side of the lens to form a light spot; in which, as illustrated in FIGS. 2-3, the lens has a rotating convex surface (101) with the optical axis (103) as the rotating axis and a flat end surface (102) opposite to the rotating convex surface (101), the curve (104) on the intersection between the rotating convex surface (101) and an arbitrary longitudinal section (2) which crosses the lens optical axis (103) is a curve which can refract incoming light (3), which is radially distributed within the longitudinal section (2) and parallel to the optical axis (103), to the receiving surface (4) to form a focal line, the curve function for the curve (104), in a planar coordinate system located on the longitudinal sectional surface (2) with the origin of the coordinate system (A) being the center of the flat end surface (102), can be described as follows:

$$(h+y)\frac{n\frac{dy}{dx}}{\sqrt{1+\left(\frac{dy}{dx}\right)^2}} - \frac{dy}{dx}\sqrt{1-n^2\frac{\left(\frac{dy}{dx}\right)^2}{1+\left(\frac{dy}{dx}\right)^2}}}{\sqrt{1-n^2\frac{\left(\frac{dy}{dx}\right)^2}{1+\left(\frac{dy}{dx}\right)^2}} + n\sqrt{\frac{\left(\frac{dy}{dx}\right)^2}{1+\left(\frac{dy}{dx}\right)^2}}} = \left(1+\frac{b}{a}\right)x$$

where, the coefficient h is the distance between the flat end surface (102) and the receiving surface (4); coefficient a the radius of the lens; coefficient b is the half length of the focal line; coefficient n is the refractive index of the lens; variable x is the horizontal distance between an arbitrary point (B) on the curve (104) and the lens optical axis (103), variable y is the longitudinal distance between the point (b) and flat end surface (102).

The curve function is based applicant's creative realization that, in order to produce uniformly distributed energy on the focus spot after condensing, a better solution is to proportionally condense light onto the receiving surface (4) through the rotating convex surface (101) of the lens. That is, after incoming light (3) passes through an arbitrary point (B) on the curve (104) and is refracted to the receiving surface (4), the ratio between x and m, x being the abscissa of the point on the curve function, m being horizontal distance between the projection point on the receiving surface and optical axis of the lens, should be equal to the ratio between a and b, a being the radius of the lens, b being the half length of the projection line, i.e., x/m=a/b. Based on known rules of refraction for lens and above equations, the following equations can be obtained:

$$x/m = a/b \quad (1)$$

$$\sin(\theta) = n\sin(\beta) \quad (2)$$

$$x - m = (h-y)\tan(\beta - \theta) \quad (3)$$

$$\tan(\theta) = \frac{dy}{dx} \quad (4)$$

in which, variables ϑ and β represent respectively angle of incidence and angle of refraction when light beam passes through the curve. Other coefficients and variables are already explained above. Based on the above equations, the above curve function can be obtained through mathematical derivation.

As illustrated in FIG. 2, the edge of each of the individual lens (1) is cut into polygon structure with at least three cylindrical surfaces (105); any two neighboring condensing lenses (1) in the compound-eye lens condenser are adhered together by their adjacent cylindrical surfaces (105). Evidently, that the purpose for doing such is for the convenience of forming planar arrays of condensing lenses (1) to produce a compound-eye lens condenser.

Specifically, the edge of each of the individual lens (1) is cut into quadrilateral structure with four cylindrical surfaces (105), in which, neighboring cylindrical surfaces (105) are perpendicular to each other; any two neighboring condensing lenses (1) in the compound-eye lens condenser are adhered together by their adjacent cylindrical surfaces (105) to form a rectangular array of the condensing lenses (1) for the compound-eye lens condenser.

Additional benefit of cutting the edge of the condensing lens (1) into quadrilateral structure is that the shape of focused light spot through the lens is quadrilateral, making it practical to make corresponding photovoltaic wafers (7) quadrilateral during manufacturing. Quadrilateral structure is easy to process during wafer cutting and such quadrilateral cutting saves large amount of wafer materials.

Figure 4:
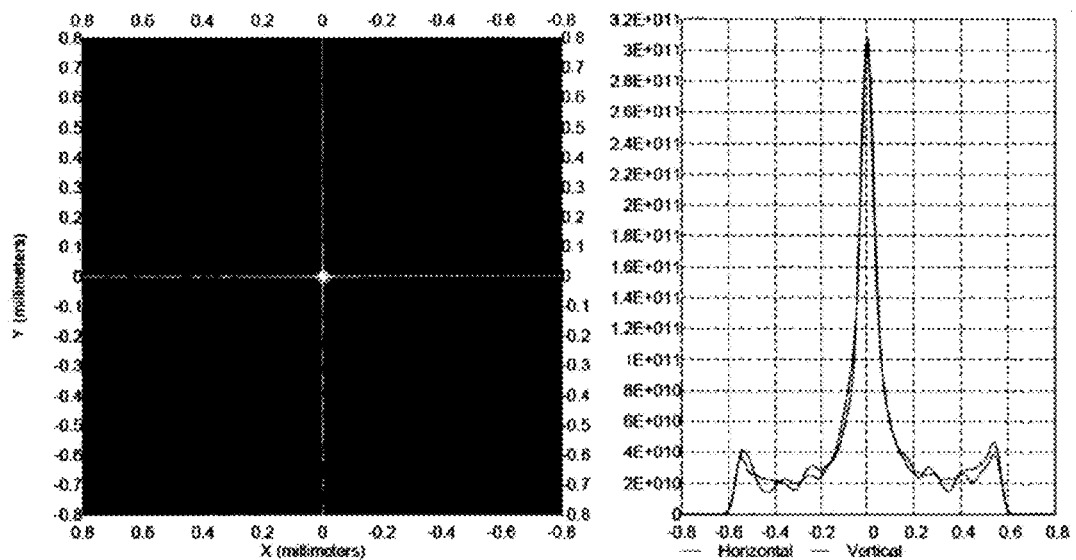
FIG. 4 is the energy distribution figure of a light spot obtained through traditional spherical convex lens.
Figure 5:
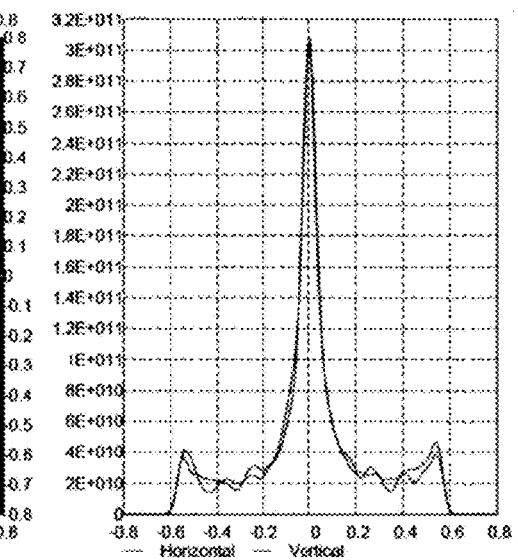
FIG. 5 the energy distribution curve of a light spot obtained through traditional spherical convex lens.
Figure 6:
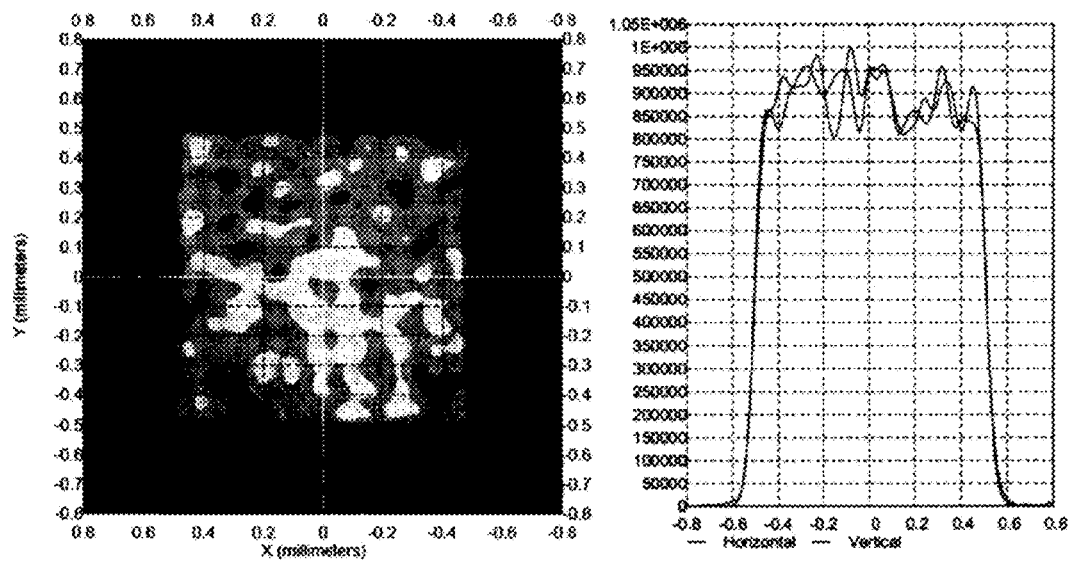
FIG. 6 is the light spot energy distribution figure of the condensing lens disclosed in the current invention.
Figure 7:
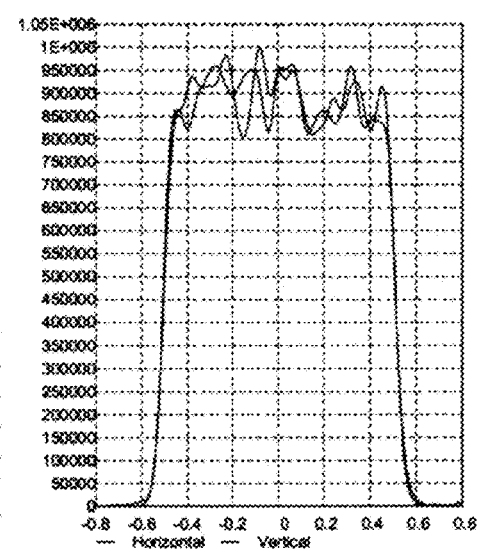
FIG. 7 is the light spot energy distribution curve of the condensing lens disclosed in the current invention.

The following is a comparison of the energy distribution in the focused light spot between a spherical convex lens and the condensing lens (1) disclosed in the current invention, which is implemented in the compound-eye lens condenser of compound-eye concentrating-type solar cell assembly disclosed in the current invention. The focused light spot energy distribution of an ordinary spherical convex lens is illustrated in FIG. 4, the brightness is the highest in the center of the light spot, and the brightness decreases abruptly toward the edge; a wave curve with abrupt drop is illustrated in FIG. 5. FIGS. 4-5 show that energy is concentrated in the center of the light spot and not uniformly distributed. As illustrated in FIG. 6, the rectangular light spot produced by the condensing lens (1) disclosed in the current invention has an uniformly distributed brightness; as illustrated in FIG. 7, the curve is almost saddle-shaped, showing that the energy levels in different locations of the light spot are all close to the peak of the saddle-shaped curve, thus energy distribution is relatively uniform.

Further, the transmission rate of the condensing lens is proved by optical simulation to be as high as 90% to 93%, while the transmission rate of Fresnel lens is around 75%. It shows that the condensing lens disclosed in the current invention has a good transmission rate.

Additionally, it should be pointed out that the total energy of incident light in the above two experiments is adjusted to the same level, and the areas of light spot on the receiving surface are kept the same. As illustrated in FIG. 7, the peak of the curve is not very smooth and fluctuates in certain range, the reason for that is, in the simulation; solar spectrum is simulated whose energy does not have a uniform distribution.

Figure 8:
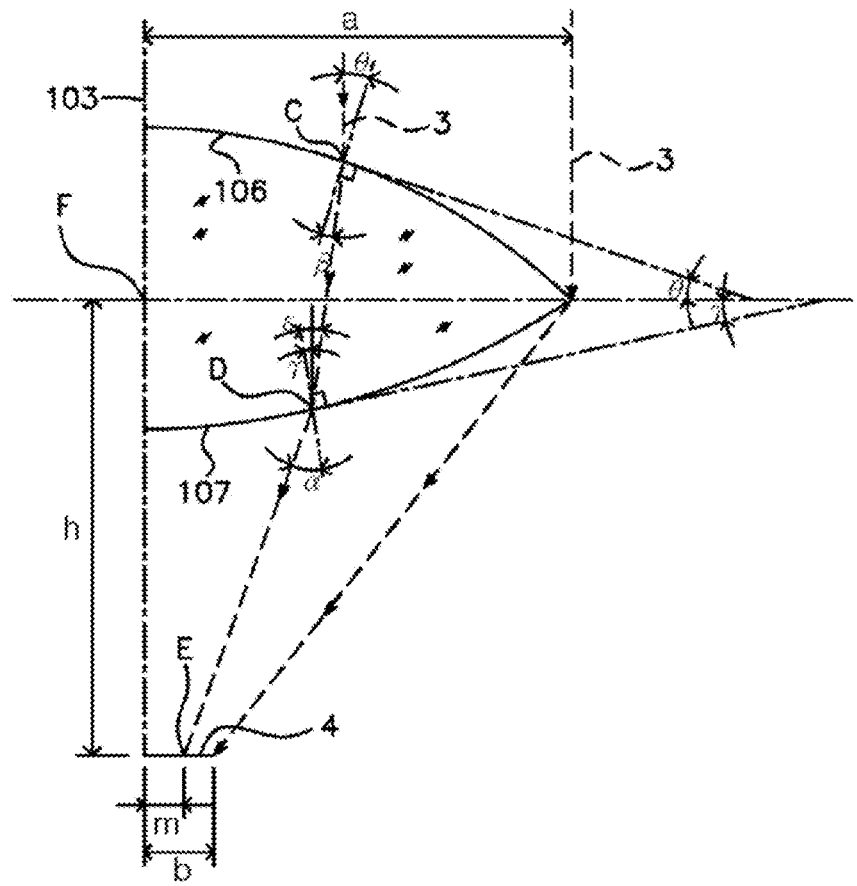
FIG. 8 is the illustration of another embodiment of the condensing lens disclosed in the current invention.

The condensing lens (1) disclosed in the current invention can also be implemented as illustrated in FIG. 8. FIG. 8 show a double-convex lens with two rotating convex surfaces. Curve 106 and curve 107, as illustrated in FIG. 8, are produced by crossing between any longitudinal section (2) which contains the lens optical axis (103) and those two rotating convex surfaces. If, as illustrated in FIG. 8, F is set as origin of the coordinate system (optical center of the lens), a is the radius of the lens, b is the perpendicular distance between the optical axis 103 and projection point on receiving surface 4 produce by the light beam refracted by the lens, point C(x, y) is the point of intersection between curve 106 and an arbitrary incoming light 3, point D(x1, y1) is the point of intersection between curve 107 and the incoming light 3 which has already been refracted by curve 106, the incoming light 3 is refracted twice by the lens to produce a projection point E(m, h) on the receiving surface, γ is the angle between optical axis 103 and the normal line at point D on the curve 107, $\vartheta$ is the incident angle, β is the refractive angle, ε is the incident angle at point D, α is the refractive angle at point D, where γ, $\vartheta$, β, ε and α are all unknown variables, the following equations can be obtained:

$$x/m = a/b \qquad (1)$$

$$\sin(\theta) = n\sin(\beta) \qquad (2)$$

$$\tan(\theta) = \frac{dy}{dx} \qquad (3)$$

$$\tan(\theta - \beta) = (x - x1)/(y + y1) \qquad (4)$$

$$\sin(\alpha) = n\sin[\gamma + (\theta - \beta)] \qquad (5)$$

$$\tan(\alpha - \gamma) = (x1 - m)/(h - y1) \qquad (6)$$

$$\tan\gamma = \frac{dy1}{dx1} \qquad (7)$$

In addition, the following boundary conditions are satisfied because both surfaces of the condensing lens are rotating convex surfaces:

If x=0, tan $\vartheta$ =0; if x1=0, tan γ=0.

The curve functions of curves 106 and 107 can thus be derived.

According to the two embodiments discussed above, the key to current invention is the idea that: x is the perpendicular distance between the point of intersection, where an arbitrary incoming light 3 intersecting the lens, and the optical axis 103 of the lens, m is the perpendicular distance between the projection point, generated by the refracted incoming light projected on the receiving surface 4, and the center of the light spot, a is the radius of the lens, b is the radius of the light spot, then the condition x/m=a/b is satisfied by the lens.

The invention claimed is:

1. A condensing lens comprising a convex surface and an optical axis,
    wherein the condensing lens refracts a bundle of incident rays to form a light spot on a receiving surface located away from the condensing lens,
    wherein when x is a distance between an intersection point of an incident ray with the convex surface and the optical axis,
    m is a distance between a projection point of the refracted ray on the receiving surface and the optical axis,
    a is a radius of the lens, and
    b is a radius of the light spot,
    then x/m=a/b.

2. The condensing lens of claim 1, further comprises to a flat end surface opposing to the convex surface,
    wherein any curve formed by intersecting the convex surface with an imaginary plane extending through the optical axis has a following curve function:

$$(h+y)\frac{n\frac{dy}{dx}}{\sqrt{1+\left(\frac{dy}{dx}\right)^2}} - \frac{dy}{dx}\sqrt{1-n^2\frac{\left(\frac{dy}{dx}\right)^2}{1+\left(\frac{dy}{dx}\right)^2}}}{\sqrt{1-n^2\frac{\left(\frac{dy}{dx}\right)^2}{1+\left(\frac{dy}{dx}\right)^2}} + n\frac{\left(\frac{dy}{dx}\right)^2}{1+\left(\frac{dy}{dx}\right)^2}}} = \left(1+\frac{b}{a}\right)x$$

wherein the curve function is in a planar coordinate system having an origin at the center of the flat end surface, coefficient h is the distance between the flat end surface and the receiving surface, coefficient n is the refractive index of the lens, variable x is the horizontal distance between an arbitrary point on the curve and the lens optical axis, and variable y is the longitudinal distance between the arbitrary point and flat end surface.

3. The condensing lens of claim 2, wherein the lens is a polygon structure having at least three surfaces parallel to the optical axis.

4. The condensing lens of claim 3, wherein the polygon structure has four surfaces parallel to the optical axis.

5. The condensing lens of claim 3, wherein the surfaces parallel to the optical axis are substantially flat.

6. A compound-eye lens condenser, comprises a plurality of condensing lenses arranged in a planar array,
wherein each condensing lens has a convex surface and an optical axis, wherein each condensing lens refracts a bundle of incident rays to form a light spot on a receiving surface located away from the condensing lens,
wherein when x being is a distance between an intersection point of an incident ray with the convex surface and the optical axis,
m being is a distance between a projection point of the refracted ray on the receiving surface and the optical axis,
a being is a radius of the lens, and
b being is a radius of the light spot,
then x/m=a/b.

7. The compound-eye lens condenser of claim 6, wherein each condensing lens comprises a flat end surface opposing to the convex surface,
wherein any curve formed by intersecting the convex surface with an imaginary plane extending through the optical axis has a following curve function:

$$(h+y)\frac{n\frac{dy}{dx}}{\sqrt{1+\left(\frac{dy}{dx}\right)^2}} - \frac{dy}{dx}\sqrt{1-n^2\frac{\left(\frac{dy}{dx}\right)^2}{1+\left(\frac{dy}{dx}\right)^2}}}{\sqrt{1-n^2\frac{\left(\frac{dy}{dx}\right)^2}{1+\left(\frac{dy}{dx}\right)^2}} + n\sqrt{\frac{\left(\frac{dy}{dx}\right)^2}{1+\left(\frac{dy}{dx}\right)^2}}} = \left(1+\frac{b}{a}\right)x$$

wherein the curve function is in a planar coordinate system having an origin at the center of the flat end surface, coefficient h is the distance between the flat end surface and the receiving surface, coefficient n is the refractive index of the lens, variable x is the horizontal distance between an arbitrary point on the curve and the lens optical axis, and variable y is the longitudinal distance between the arbitrary point and flat end surface.

8. The compound-eye lens condenser of claim 7, wherein each of the condensing lenses is a polygon structure having at least three surfaces parallel to the optical axis of the condensing lens, wherein two adjacent condensing lenses are adhered together at their respective adjacent surfaces.

9. The compound-eye lens condenser of claim 8, wherein the polygon structure has four surfaces parallel to the optical axis of the condensing lens.

10. The compound-eye lens condenser of claim 8, wherein the surfaces parallel to the optical axis are substantially flat.

11. A compound-eye concentrating-type solar cell assembly, comprising:
a compound-eye lens condenser of claim 6, and
a plurality of photovoltaic wafers installed on a circuit board,
wherein the compound-eye lens condenser condenses light onto the plurality of photovoltaic wafers.

12. The compound-eye concentrating-type solar cell assembly of claim 11, wherein each condensing lens in the compound-eye lens condenser comprises a flat end surface opposing to the convex surface,
wherein any curve formed by intersecting the convex surface with an imaginary plane extending through the optical axis has a following curve function:

$$(h+y)\frac{n\frac{dy}{dx}}{\sqrt{1+\left(\frac{dy}{dx}\right)^2}} - \frac{dy}{dx}\sqrt{1-n^2\frac{\left(\frac{dy}{dx}\right)^2}{1+\left(\frac{dy}{dx}\right)^2}}}{\sqrt{1-n^2\frac{\left(\frac{dy}{dx}\right)^2}{1+\left(\frac{dy}{dx}\right)^2}} + n\sqrt{\frac{\left(\frac{dy}{dx}\right)^2}{1+\left(\frac{dy}{dx}\right)^2}}} = \left(1+\frac{b}{a}\right)x$$

wherein the curve function is in a planar coordinate system having an origin at the center of the flat end surface, coefficient h is the distance between the flat end surface and the receiving surface, coefficient n is the refractive index of the lens, variable x is the horizontal distance between an arbitrary point on the curve and the lens optical axis, variable y is the longitudinal distance between the arbitrary point and flat end surface.

* * * * *